United States Patent [19]
Lelie

[11] 3,786,363
[45] Jan. 15, 1974

[54] VOLTAGE-CONTROLLED LOW-PASS FILTER

[75] Inventor: Arthur S. Lelie, Los Angeles, Calif.

[73] Assignee: The United States of America as represented by the Secretary of the Navy, Washington, D.C.

[22] Filed: Jan. 5, 1973

[21] Appl. No.: 321,185

[52] U.S. Cl. .......... 330/31, 328/167, 330/21, 330/107, 330/109
[51] Int. Cl. .......... H03f 3/04, H03f 1/36
[58] Field of Search .......... 328/167; 330/21, 330/31, 107, 109

[56] References Cited

UNITED STATES PATENTS

| | | | |
|---|---|---|---|
| 3,564,441 | 2/1971 | Eide | 330/109 X |
| 904,030 | 11/1972 | Davie | 328/167 X |

*Primary Examiner*—Herman Karl Saalbach
*Assistant Examiner*—Lawrence J. Dahl
*Attorney*—Richard S. Sciascia, Ervin F. Johnston and John Stan

[57] ABSTRACT

An active low-pass filter whose cutoff frequency is a function of the input voltage to the filter comprising a series connection from the input to the filter to ground which consists of: (1) an input resistor $r$, (2) a capacitor C, and (3) a grounded resistor R. A series connection across the capacitor C comprises: (*a*) a feedback amplifier having two input leads, one of which is grounded, the other lead being connected to that side of the capacitor nearest ground; and (*b*) a feedback resistor $\rho$, one end being connected to the output of the feedback amplifier, the other end being connected to the ungrounded side of the capacitor. The feedback amplifier may be an operational amplifier. The output of the filter is at the junction of the resistors $r$ and $\rho$ and the capacitor C.

6 Claims, 4 Drawing Figures

ACTIVE LOW-PASS FILTER.

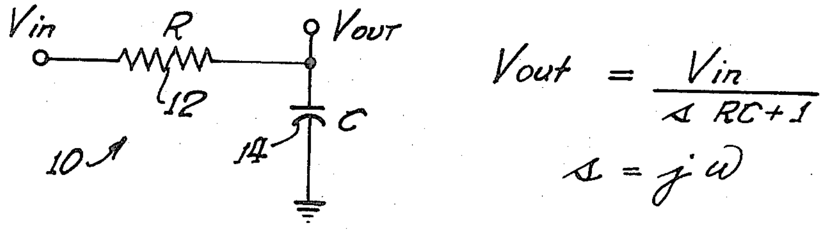
FIG. 1. (PRIOR ART) BASIC R-C FILTER
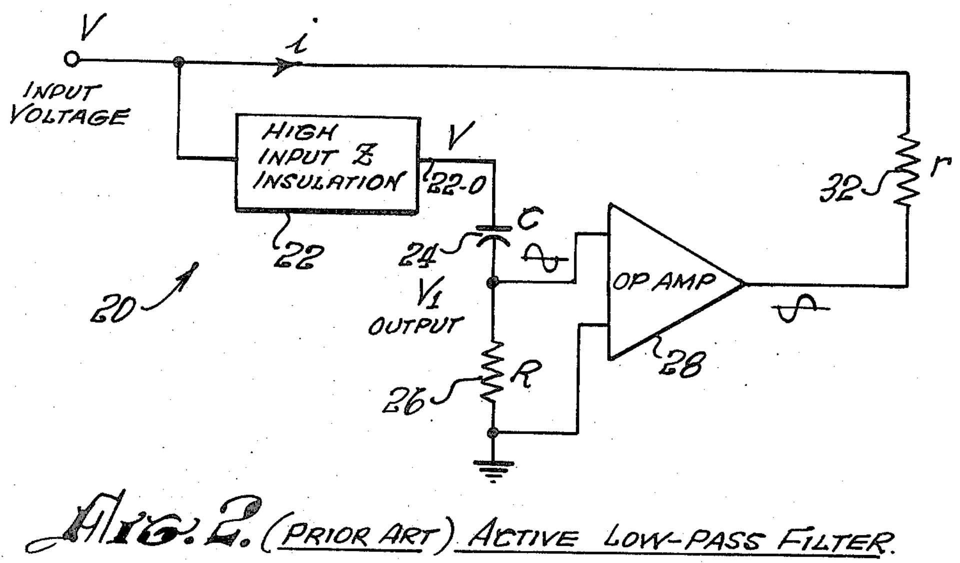
FIG. 2. (PRIOR ART) ACTIVE LOW-PASS FILTER.
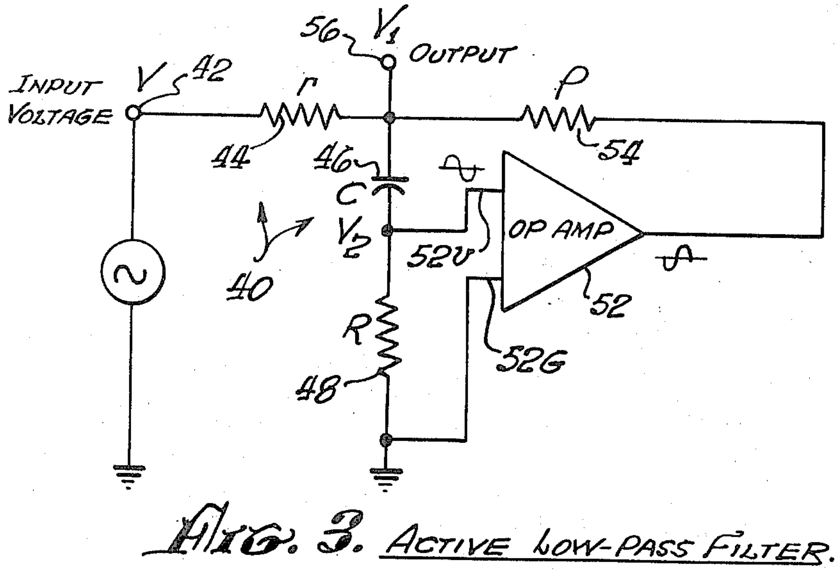
FIG. 3. ACTIVE LOW-PASS FILTER.

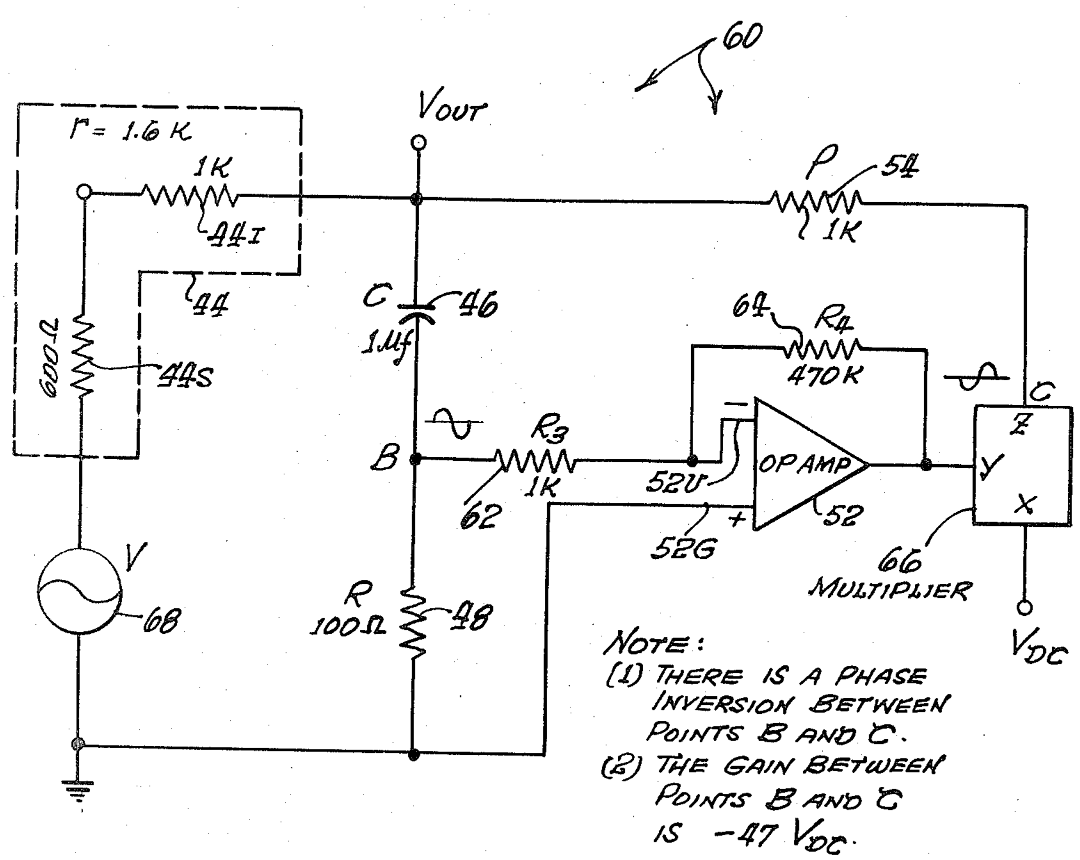
FIG. 4. MORE SOPHISTICATED ACTIVE LOW-PASS FILTER.

VOLTAGE-CONTROLLED LOW-PASS FILTER

STATEMENT OF GOVERNMENT INTEREST

The invention described herein may be manufactured and used by or for the Government of the Unites States of America for governmental purposes without the payment of any royalties thereon or therefor.

BACKGROUND OF THE INVENTION

This invention relates to low-pass filters which pass low-frequency elecrical signals and attenuate high frequency electrical signals. Included is a variable control for the amount of attenuation of higher frequencies; i.e., there is a control over which specific frequency gives 3 db attenuation. This control is implemented by a voltage.

At present, low-pass filters can be made with fixed resistors and capacitors. There exist voltage-controlled resistors and capacitors but they have d-c offsets, since, effectively they operate as reverse-biased diodes. The largest voltage-controlled capacitor now available cannot have a capacitance greater than 0.001 $\mu$f, thus it cannot be used at very low frequencies.

SUMMARY OF THE INVENTION

The invention relates to a low-pass filter whose cutoff frequency is a function of the input voltage to the filter comprising a series connection from the input to the filter to ground which comprises an input resistor $r$, a capacitor C, and a grounded resistor R. A series connection across the capacitor C comprises ($a$) a feedback amplifier having two input leads, one of which is grounded, the other lead being connected to that of the capacitor nearest ground; and ($b$) a feedback resistor $\rho$, one end being connected to the output of the feedback amplifier, the other end being connected to the ungrounded side of the capacitor. The output of the filter is at the junction of the resistors $r$ and $\rho$ and the capacitor C.

OBJECTS OF THE INVENTION

An object of the invention is to provide a low-pass filter in which the lower cutoff frequency may be varied.

Another object of the invention is to provide a low-pass filter in which the lower cutoff frequency may be varied by varying a voltage.

Yet another object of the invention is to provide a low-pass voltage-controlled filter which does not require any voltage-controlled capacitors or resistors.

Other objects, advantages, and novel features of the invention will become apparent from the following detailed description of the invention, when considered in conjunction with the accompanying drawings, wherein:

BRIEF DESCRIPTION OF THE DRAWINGS

FIG. 1 is a schematic diagram of a prior art basic, low-pass, filter with a minimum number of elements.

FIG. 2 is a schematic diagram of another prior art low-pass filter which is an active filter.

FIG. 3 is a schematic diagram of the active low-pass filter of this invention.

FIG. 4 is a schematic diagram of a novel, more sophisticated, active low-pass filter.

DESCRIPTION OF THE PREFEFFED EMBODIMENTS

Referring now to FIG. 3, therein is shown a low-pass filter 40 whose cutoff frequency is a function of the input voltage V at terminal 42 to the filter comprising a series connection from the input to the filter to ground comprising: an input resistor $r$, labeled 44, a capacitor C, labeled 46, and a grounded resistor R, labeled 48.

A series connection across the capacitor 46 comprises ($a$) a feedback amplifier 52 having two input leads, one of which 52G, is grounded, the other lead 52U being connected to the grounded side of the capacitor 46; and ($b$) a feedback resistor $\rho$, labeled 54, having a resistance approximately equal to that of the resistor $r$, one end being connected to the output of the feedback amplifier, the other end being connected to the ungrounded side of the capacitor. As shown in the figures, the feedback amplifier may be an operational amplifier 52, for example the type 1024 manufactured by the Teledyne Philbrick Nexus Co., located at Allied Drive at Route 128, in Dedham, Mass. 02026.

The output 56 of the filter 40 is at the junction of the resistors $r$ and $\rho$ and the capacitor C.

In the low-pass filter 40 shown in FIG. 3, typical values for the various parameters are as follows: the input resistor $r$ may have a resistance in the range of 1,500$\Omega$, the capacitance of capacitor C maybe in the range of 1$\mu$f, and the resistance of the resistor R may have a value in the range of 100$\Omega$.

The more sophisticated low-pass filter 60 shown in FIG. 4 may further comprise a third resistor 62, one lead of which is connected between the junction of the capacitor 46 and the grounded resistor 48, and the other lead of which is connected to the ungrounded input lead 52U to the operational amplifier 52. The low-pass filter 60 further comprises a fourth resistor 64, one end being connected to the ungrounded lead 52U of the operational amplifier 52, the other end being connected to the output of the operational amplifier.

To obtain additional amplification, the low-pass filter 60 may further comprise a multiplier 66 having three terminals, X, Y and Z, the X terminal being connected to an input direct-current voltage $V_{DC}$, the Y terminal being connected to the output of the operational amplifier 52, and the Z terminal being connected to the other end of the feedback resistor $\rho$. A suitable multiplier is the model 426A manufactured by Analog Devices, Inc., located at 221 Fifth Street, in the city of Cambridge, Mass. 02142. The multiplier 66 is, effectively, a variable-gain, controlled voltage, amplifier. The a-c voltage going to terminal Y of the multiplier 66 is amplified by the multiplier by an amount which is proportional to the d-c voltage $V_{DC}$ supplied at terminal X. A typical voltage relationship is: $Z$ = output of multiplier 66 $= XY/10$ .

Typical values for low-pass filter 60 shown in FIG. 4 follow. The input resistor $r$, labelled 44, has a value of resistance in the range of 1,600$\Omega$, where, as shown, the value of $r$ includes the 600-$\Omega$ internal resistance 44S of the voltage source 68 as well as the 1,000-$\Omega$ input resistance of the filter.

As in the embodiment 40 shown in FIG. 3, the capacitor 46 may have a value of capacitance in the range of 1 $\mu$f, the resistor 48 may have a value in the range of 100$\Omega$, and the feedback resistor 54 may have a value in the range of 1,000Ω. The third resistor 62 may have a value of resistance in the range of 1,000Ω, and the fourth resistor 64 may have a value of resistance in the range of 470 KΩ.

Typically the combined gain A of the operational amplifier 52 and the multiplier 66 may be equal to −47 $V_{DC}$.

Discussing now the mathematical relationships upon which the invention is based, reference is directed to FIG. 1, which shows a very basic low-pass filter 10, having a resistor 12 and a capacitor 14. Now, consider a general technique of simulating a large capacitor as shown in the embodiment 20 as shown in FIG. 2. An input voltage $V$ is put through a high input impedance insulator 22 and made to appear at the output 22-0 of the insulator. The function of the block 22 labeled HIGH INPUT Z INSULATION is to present a high impedance to the current so that most of the current will flow in the top branch labeled $i$. The output 22-0 from the insulator 22 then goes through a voltage divider consisting of the capacitor 24 and the resistor 26. The output from this divider $V_1$ is $$V_1=\frac{VR}{R+\frac{1}{_sC}}=\frac{V_sRC}{_sRC+1} \qquad (1)$$

If the sRC term is much smaller than one, then $V_1$ has been shifted about 90° with respect to $V$. This phase-shifted voltage is amplified by operational amplifier 28, and fed back through a resistor 32 back to the original point $V$. This causes a current $i$ which leads the voltage $V$ by 90°. This is the same effect a capacitor gives as it causes a current which leads the voltage by 90°.

The discussion hereinabove leads naturally to the circuit of FIG. 3. Analysis, as indicated in the Appendix, shows that the output voltage $V_1$ is given by the equation:

$$V_1=\frac{V}{\frac{r}{\rho}+1+\frac{_sCr(\rho-AR)}{(_sCR+1)\rho}} \qquad (2)$$

This assumes that the resistor 44, or $r$, is the sum of a resistor in series with the internal resistance of the voltage source 68, and that the voltage $V_1$ feeds into a high impedance component.

When appropriate values are chosen for $r$, $R$, $C$, $A$ and $\rho$ such as shown in FIG. 4, then the output voltage is:

$$V_1=\frac{V}{2.6+\frac{s(1.6-.16A)}{0.1_s+10^3}} \qquad (3)$$

At low frequencies and large amplification $A$ the above equation is approximately equal to $$V_1=\frac{V}{2.6+\frac{s(-0.16A)}{10^3}} \qquad (4)$$

Since the amplification $A$ is negative because of the operational amplifier 52, the equation can be changed to:

$$V_1=\frac{\frac{1}{2.6}V}{1+\frac{s0.16A}{2.6\times10^3}} \qquad (5)$$

$$V_1=\frac{0.385V}{1+s6.16\times10^{-5}} \qquad (6)$$

Clearly this shows that the circuit behaves just like the simple RC circuit of FIG. 1 with the capacitor equal to $6.16\times10^{-5}$ $A$.

The amplification $A$ in FIG. 4 is that of the operational amplifier 52 times that of the multiplier 66. The output of the multiplier 66 is:

$$Z=XY/10 \qquad (7)$$

By feeding the operational amplifier output to terminal $Y$ and with the use of a d-c control voltage $V_{DC}$ to terminal $X$ the gain factor $A$ can be changed electrically to give a voltage-controlled low pass filter.

The circuit of FIG. 4 has the following characteristics: it acts like a simple RC filter from d-c up to frequency of 700 hertz. When the multiplier control voltage $V_{DC}$ is at + 2V the cutoff frequency is 25 hertz, when the control voltage is + 7.5V the cutoff frequency is 7 hertz. By increasing the control voltage $V_{DC}$ the cutoff frequency is lowered; the maximum control voltage the multiplier can handle, without distortion, is 10.5V.

The maximum output of the signal source 68 may be has high as 2.8V rms, otherwise there is distortion due to saturation of the operational amplifier 52. If there is an interest in frequencies up to 150 hertz, then the signal source 68 can have a value as low as 3.5 mv rms; there is a noise masking when small signals are attenuated. The masking occurs when the output voltage $V_1$ goes down to 0.15 mv rms.

The combination of operational amplifier 52 and multiplier 66 to give a gain of $-A$ may be changed. An operational amplifier with a larger gain-bandwidth product may be used and allow work at higher frequencies. Also components with better noise characteristics may be used for small signals. The operational amplifier 52 and multiplier 66 could be combined into one unit which would be a voltage controlled amplifier; this amplifier must have a high input impedance, low output impedance, and give a negative gain.

Advantages of the embodiments of this invention over prior art methods are that it is voltage controlled for continuously variable gains while it has no direct-current offset voltages. The circuits can be used at very low frequencies without having a large bulky capacitor.

One feature that is novel is that of using a simulated capacitor in such a manner that the overall circuit behaves exactly like a low-pass circuit with an actual large capacitor.

With respect to alternative embodiments, the value of any of the passive components may be changed and overall results may be deduced from the equations given. This will enable working within any frequency range as desired. The operational amplifier 52 and multiplier 66 may be replaced by other operational amplifiers and multipliers, or both together by a voltage-controlled amplifier.

APPENDIX

In this appendix, equations derived from the embodiment 40 shown in FIG. 3 will be developed, in the final equation to result in Eq. (2). It may readily be shown that the equations, (8) and (9), immediately below, follow as a consequence of the circuit shown in FIG. 4

$$V_2=\frac{V_1R}{\frac{1}{sC}+R}=\frac{V_1sCR}{1+sCR} \quad (8)$$

$$V_1=\frac{\frac{AV_2(sCR+1)r}{sCR+1+sCr}}{\frac{(sCR+1)r}{sCR+1+sCR}+\rho}+\frac{\frac{V(sCR+1)\rho}{sCR+1+sC\rho}}{\frac{(sCR+1)\rho}{sCR+1+sC\rho}+r} \quad (9)$$

By combining terms in Eq. (9) to obtain both right-hand members in the form of simple fractions, Eq. (10) is obtained.

$$V_1=\frac{AV_2(sCR+1)r}{(sCR+1)r+\rho(sCR+1+sCR}+\frac{V(sCR+1)\rho}{(sCR+1)\rho+r(sCR+1+sC\rho)} \quad (10)$$

Substituting the value of $V_2$ from Eq. (8) into Eq. (10), Eq. (11) is obtained. It will be noted that the term $V_1$ occurs on both sides of Eq. (11).

$$V_1=\frac{AV_1sCRr}{(sCR+1)r+\rho(sCR+1+sCr)}+\frac{V(sCR+1)\rho}{(sCR+1)\rho+r(sCR+1+sC\rho)} \quad (11)$$

After some rather involved algebraic manipulation, the terms in $V_1$, on both sides of the Eq. (11), may be combined to result in an equation for $V_1$ in terms of $V$.

$$V_1=\frac{\frac{V(sCR+1)\rho}{(sCR+1)\rho+r(sCR+1+sC\rho)}}{1-\frac{sACRr}{(sCR+1)r+\rho(sCR+1+sCr)}} \quad (12)$$

By first making a simple fraction of the right side of Eq. (12), and then judiciously combining terms, Eq. (15), which is identical to Eq. (2), is eventually obtained.

$$V_1=\frac{V(sCR+1)\rho}{(sCR+1)r+\rho(sCR+1+sCr)-sACRr} \quad (13)$$

$$V_1=\frac{V}{\frac{r}{\rho}+1+\frac{sCr\rho}{(sCR+1)\rho}-\frac{sACRr}{(sCR+1)\rho}} \quad (14)$$

$$V_1=\frac{V}{\frac{r}{\rho}+1+\frac{sCr(\rho-AR)}{(sCR+1)\rho}} \quad (15)$$

Obviously many modifications and variations of the present invention are possible in the light of the above teachings. It is therefore to be understood that within the scope of the appended claims the invention may be practiced otherwise than as specifically described.

What is claimed is:

1. A low-pass filter whose cutoff frequency is a function of the input voltage to the filter comprising:

a series connection from the input to the filter to ground comprising:
1. an input resistor *r;*
2. a capacitor *C;*
3. a grounded resistor *R;* a series connection across the capacitor *C* comprising:

a feedback amplifier having two input leads, one of which is grounded, the other lead being connected to that side of the capacitor nearest ground; and a feedback resistor $\rho$, having one end being connected to the output of the feedback amplifier, the other end being connected to the ungrounded side of the capacitor;

the output of the filter being at the junction of the resistors *r* and $\rho$ and the capacitor *C.*

2. The low-pass filter according to claim 1, wherein the feedback amplifier is an operational amplifier.

3. The low-pass filter according to claim 2, wherein the input resistance *r* has a resistance in the range of 1,500Ω;

the capacitance C is in the range of 1μf; and the resistor R has a value in the range of 100Ω.

4. The low-pass filter according to claim 2, further comprising:

a third resistor, one lead of which is connected between the junction of the capacitor *C* and the grounded resistor *R* and the other lead of which is connected to the ungrounded input lead to the operational amplifier; and a fourth resistor, one end being connected to the ungrounded lead of the operational amplifier, the other end being connected to the output of the operational amplifier.

5. The low-pass filter according to claim 4, further comprising:

a multiplier having three terminals, X, Y and Z;

the X terminal being connected to an input direct-current voltage $V_{DC}$;

the Y terminal being connected to the output of the operational amplifier;

the Z terminal being connected to the other end of the feedback resistor $\rho$;

the voltages at the terminals of the multiplier being related by the equation $Z = XY/10$.

6. The low-pass filter according to claim 5 wherein the input resistor *r* has a value of resistance in the range of 1,600Ω;

the capacitor *C* has a value of capacitance in the range of 1 μf;

the resistor *R* has a value in the range of 100Ω;

the feedback resistor $\rho$ has a value in the range of 1,000Ω;

the third resistor has a value of resistance in the range of 1,000Ω; and the fourth resistor has a value of resistance in the range of 470 KΩ;

the gain A of the operational amplifier being equal to $-47\ V_{DC}$.

* * * * *